(12) United States Patent
Sieber et al.

(10) Patent No.: US 9,983,647 B2
(45) Date of Patent: *May 29, 2018

(54) BATTERY MANAGEMENT SYSTEM

(71) Applicant: DELL PRODUCTS, LP, Round Rock, TX (US)

(72) Inventors: John R. Sieber, Cedar Park, TX (US); Munir U. Ahmad, Austin, TX (US); Philip D. Chidester, Austin, TX (US)

(73) Assignee: DELL PRODUCTS, LP, Round Rock, TX (US)

( * ) Notice: Subject to any disclaimer, the term of this patent is extended or adjusted under 35 U.S.C. 154(b) by 0 days. days.

This patent is subject to a terminal disclaimer.

(21) Appl. No.: 15/079,507

(22) Filed: Mar. 24, 2016

(65) Prior Publication Data

US 2016/0202747 A1 Jul. 14, 2016

Related U.S. Application Data

(63) Continuation of application No. 13/853,560, filed on Mar. 29, 2013, now Pat. No. 9,304,563.

(51) Int. Cl.
*G01R 31/36* (2006.01)
*G06F 1/26* (2006.01)
*G06F 1/28* (2006.01)

(52) U.S. Cl.
CPC .............. *G06F 1/28* (2013.01); *G01R 31/36* (2013.01); *G06F 1/263* (2013.01)

(58) Field of Classification Search
CPC .. G01R 31/3606; G01R 31/3658; G06F 1/263
USPC ............................................. 702/63; 320/130
See application file for complete search history.

(56) References Cited

U.S. PATENT DOCUMENTS

| | | | |
|---|---|---|---|
| 4,707,795 A | 11/1987 | Alber et al. | |
| 5,438,250 A | 8/1995 | Retzlaff | |
| 5,543,245 A | 8/1996 | Andrieu et al. | |
| 6,329,792 B1 | 12/2001 | Dunn et al. | |
| 6,618,681 B2 | 9/2003 | Hoenig et al. | |
| 7,345,455 B2 | 3/2008 | Jones | |
| 7,710,075 B1 | 5/2010 | Kilbourne, II et al. | |
| 7,840,840 B2 | 11/2010 | Takahashi et al. | |
| 8,129,946 B2 | 3/2012 | Wang et al. | |
| 8,129,947 B2 | 3/2012 | Chiasson et al. | |
| 8,179,094 B2 | 5/2012 | Anupindi et al. | |
| 2002/0167293 A1 | 11/2002 | Ptasinski et al. | |
| 2009/0146610 A1 | 6/2009 | Trigiani | |
| 2011/0072280 A1 | 3/2011 | Chiasson et al. | |
| 2012/0306504 A1 | 12/2012 | van Lammeren | |

*Primary Examiner* — Mark Connolly
(74) *Attorney, Agent, or Firm* — Larson Newman, LLP

(57) ABSTRACT

A method includes determining a need to perform a learn cycle on a battery in a processing module of an information handling system, detecting a learn cycle in progress on another battery in another processing module of the information handling system, and postponing the learn cycle on the battery in response to detecting the learn cycle on the other battery.

19 Claims, 4 Drawing Sheets

BATTERY MANAGEMENT SYSTEM

CROSS REFERENCE TO RELATED APPLICATIONS

This application is a continuation of U.S. patent application Ser. No. 13/853,560, entitled "Battery Management System," filed on Mar. 29, 2013, the disclosure of which is hereby expressly incorporated by reference in its entirety.

FIELD OF THE DISCLOSURE

The present disclosure generally relates to information handling systems, and more particularly relates to battery management systems for information handling systems.

BACKGROUND

As the value and use of information continues to increase, individuals and businesses seek additional ways to process and store information. One option is an information handling system. An information handling system generally processes, compiles, stores, and/or communicates information or data for business, personal, or other purposes. Because technology and information handling needs and requirements may vary between different applications, information handling systems may also vary regarding what information is handled, how the information is handled, how much information is processed, stored, or communicated, and how quickly and efficiently the information may be processed, stored, or communicated. The variations in information handling systems allow for information handling systems to be general or configured for a specific user or specific use such as financial transaction processing, airline reservations, enterprise data storage, or global communications. In addition, information handling systems may include a variety of hardware and software components that may be configured to process, store, and communicate information and may include one or more computer systems, networking systems, and data storage systems.

Information handling systems may contain battery modules providing temporary backup power in the event the primary power source for the information handling system is interrupted. Some battery types used in battery modules require a learn cycle or recondition cycle to be performed periodically. The learn cycle discharges and then charges the batteries in a module, measuring the change in voltage and the amount of charge in order to build a battery discharge curve. This operation allows the information handling system to better estimate the capacity of the battery module. The chemistry of the battery in a module may have a largely flat voltage vs. charge curve, with the slope of the curve changing rapidly only at low charge levels. This characteristic of the battery may require the battery cells within a module to be discharged to a very low level in order to obtain acceptable measurement accuracy.

BRIEF DESCRIPTION OF THE DRAWINGS

It will be appreciated that for simplicity and clarity of illustration, elements illustrated in the Figures are not necessarily drawn to scale. For example, the dimensions of some elements may be exaggerated relative to other elements. Embodiments incorporating teachings of the present disclosure are shown and described with respect to the drawings herein, in which.

The use of the same reference symbols in different drawings indicates similar or identical items.

DETAILED DESCRIPTION OF THE DRAWINGS

The following description in combination with the Figures is provided to assist in understanding the teachings disclosed herein. The description is focused on specific implementations and embodiments of the teachings, and is provided to assist in describing the teachings. This focus should not be interpreted as a limitation on the scope or applicability of the teachings. However, other teachings may be utilized in this application, as well as in other applications and with several different types of architectures such as distributed computing architectures, client or server architectures, or middleware server architectures and associated components.

Figure 1:
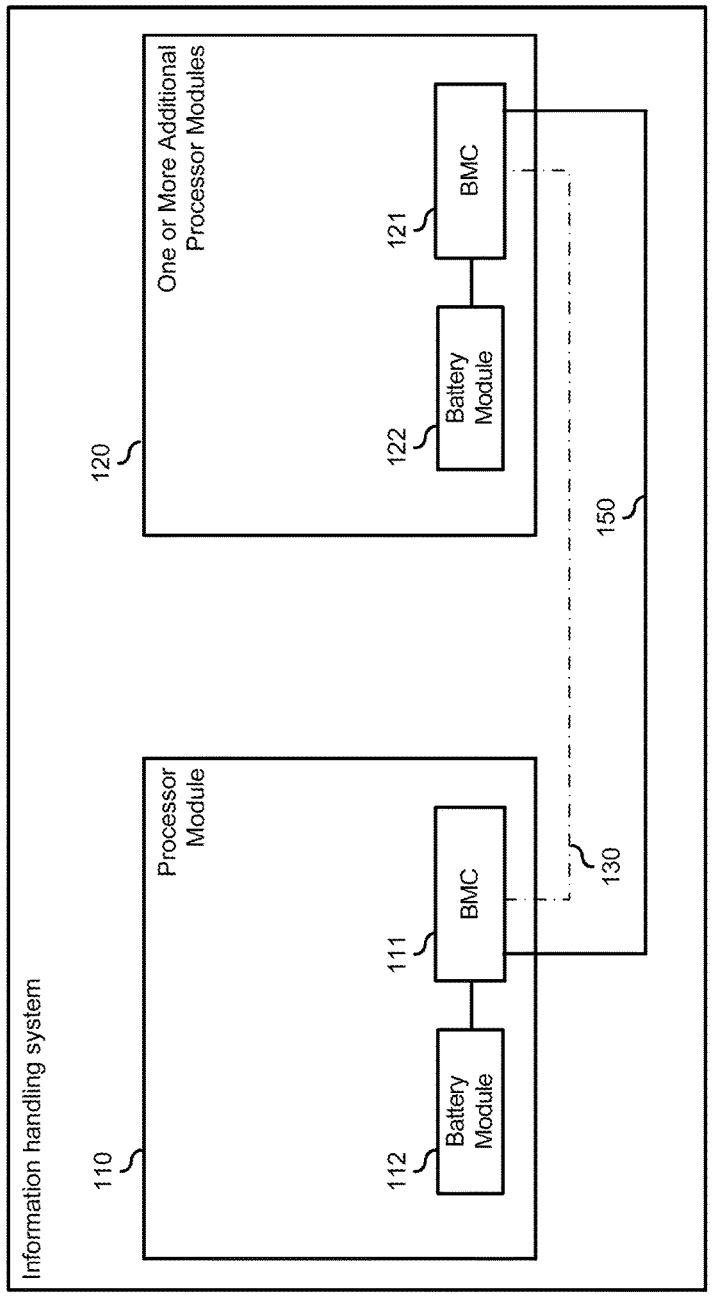
FIG. 1 is a block diagram of an information handling system according to an embodiment of the present disclosure.

FIG. 1 shows an information handling system 100 that includes processor module 110 and processor module 120. For purpose of this disclosure information handling system 100 can include any instrumentality or aggregate of instrumentalities operable to compute, classify, process, transmit, receive, retrieve, originate, switch, store, display, manifest, detect, record, reproduce, handle, or utilize any form of information, intelligence, or data for business, scientific, control, entertainment, or other purposes. For example, information handling system 100 can be a personal computer, a laptop computer, a smart phone, a tablet device or other consumer electronic device, a network server, a network storage device, a switch router or other network communication device, or any other suitable device and may vary in size, shape, performance, functionality, and price. Further, information handling system 100 can include processing resources for executing machine-executable code, such as a central processing unit (CPU), a programmable logic array (PLA), an embedded device such as a System-on-a-Chip (SoC), or other control logic hardware. Information handling system 100 can also include one or more computer-readable medium for storing machine-executable code, such as software or data. Additional components of information handling system 100 can include one or more storage devices that can store machine-executable code, one or more communications ports for communicating with external devices, and various input and output (I/O) devices, such as a keyboard, a mouse, and a video display. Information handling system 100 can also include one or more buses operable to transmit information between the various hardware components.

Processor module 110 includes baseboard management controller (BMC) 111 and battery module 112. Processor module 120 is similarly configured with BMC 121 and battery module 122. Information handling system 100 may be configured to include additional devices, for example storage devices and network interfaces, in order to perform various information handling functions. Processor module 110 and processor module 120 may be configured with additional modules, for example with CPU complexes and I/O modules, to perform various functions within information handling system 100. In an embodiment, processor module 110 and processor module 120 comprise more than one field replaceable unit. BMC 111 and BMC 121 may be connected to network 150 directly using circuitry within the baseboard management controllers, or indirectly using other interface devices (not shown) such as NIC's or LAN on motherboard (LOM) devices. BMC 111 and BMC 121 communicate through network 150 with an external system (not shown). The external system may be a laptop computer, a virtual machine, an FPGA, or other external computing device or system A system external to information handling system 100 communicating with BMC 111 and BMC 121 may be referred to herein as a system management controller or as a service processor. In an embodiment, BMC 111 and BMC 121 communicate with each other using network 150. Examples of information communicated on network 150 include commands, command responses, and status information. Communication link 130 is connected to BMC 111 and to BMC 121. In an embodiment, communication link 130 is provided by a mid-plane (not shown) within information handling system 100. In an embodiment, communication link 130 is provided by a cable. Communication link 130 is operable to allow BMC 111 and BMC 121 to exchange status information.

In an embodiment, network 130 is an inter-baseboard management controller communication link among baseboard management controllers within information handling system 100. An inter-baseboard management controller link may be a direct connection between BMC 111 and BMC 121. In an embodiment, the inter-baseboard management controller link is implemented with an inter-integrated circuit communication interface such as I2C.

Battery module 112 and battery module 122 are operable to provide power to processor module 110 and to processor module 120, respectively, in the event that the main power source for information handling system 100 is interrupted. Battery modules 112 and 122 each comprise battery cells, power regulation circuitry, charging circuitry, and control circuitry. The control circuitry is operable to communicate with other modules on processor modules 110 and 120. In the embodiment illustrated in FIG. 1, battery modules 112 and 122 are coupled to BMC 111 and to BMC 121, respectively. In an embodiment, communication between battery modules 112 and 122 and BMCs 111 and 112 takes place over an I2C communication network. The control circuitry in battery module 112 and battery module 122 is further operable to provide information about the battery module to other modules, including the capacity remaining in the battery and information identifying the particular battery module installed, for example a module serial number. The control circuitry is further operable to receive and perform commands including a command to perform a learn cycle on the battery within the battery module and a command to report a status of a learn cycle. The status of a learn cycle may include an indication that a learn cycle is in progress.

BMC 111 and BMC 121 are operable to perform management functions for processor module 110 and for processor module 120 respectively. In an embodiment, these functions include reporting sensor values to a system management controller, logging events, and receiving commands from the system management controller to perform actions within a processor module. Example sensor values that may be reported include battery voltage, temperature and cooling fan speed. Events that may be logged include, for example, loss of power to a processor module. Commands that may be received by a baseboard management controller include resetting or cycling power on a processor module, and initiating a learn cycle on a battery module. In an embodiment, a baseboard management controller initiates a learn cycle on a battery module by sending a command to initiate a learn cycle to control circuitry in the battery module. In response to receiving the command, the control circuitry performs the learn cycle. BMC 111 and BMC 121 are further operable to determine the current date and time. The current date and time may be used to provide a time stamp for log entries, to determine a need to perform a management function, or for other purposes. In an embodiment, a real time clock is maintained within a baseboard management controller and may be accessed to determine the current date and time. In alternate embodiments the current date and time are obtained by a baseboard management controller from another module within the processor module, or the current date and time are obtained from a system management controller. BMC 111 and BMC 121 are further operable to store information related to performance of management functions, including but not limited to a desired time at which a function should be performed and identification information for individual modules within their respective processor modules.

BMC 111 is operable to determine a need to initiate a learn cycle on a battery within battery module 112. In an embodiment, the need to initiate a learn cycle may be based on the elapsed time since a previous learn cycle was completed. When a learn cycle is successfully completed on a battery, BMC 111 may compute a predetermined date and time for the next learn cycle by adding a time interval to the completion date and time of the learn cycle. The predetermined date and time for the next learn cycle may be stored within BMC 111. BMC 111 may periodically compare the current date and time with the predetermined date and time, determining a need to initiate a learn cycle when the current date and time is later than the predetermined date and time. In an embodiment, BMC 111 may store the completion date and time of a learn cycle and periodically compare the stored completion date and time with the current date and time in order to determine if the time interval has elapsed. In an embodiment BMC 111 and BMC 121 may use different time intervals to determine a need to initiate a learn cycle.

In an embodiment, BMC 111 is operable to determine the need to initiate a learn cycle on a battery in battery module 112 based on identifying that battery module 112 is not the battery module on which a previous learn cycle was initiated. BMC 111 retrieves from memory a stored serial number of a battery module on which a learn cycle was previously initiated. BMC 111 retrieves the serial number from battery module 112, and compares the stored serial number with the serial number of battery module 112. Based on the comparison, BMC 111 may determine that the stored information about a next learn time for a battery module is invalid. BMC 111 may then select and store another learn time for battery module 112. BMC 111 may then be operable to proceed as described above, comparing the current date and time with the stored learn time and determining a need to initiate a learn cycle when the current date and time is later than the stored learn time.

In an embodiment, BMC 111 is operable to determine a need to initiate a learn cycle on a battery in battery module 112 in response to receiving a command from a system management controller.

BMC 111 is further operable to detect that a learn cycle is in progress on a battery in battery module 122 in processor module 120. In an embodiment, BMC 111 detects that the learn cycle on battery module 122 is in progress by detecting an indication provided by BMC 121. BMC 121 may provide the indication based on a sensor value, based on information provided by an application programming interface (API), or based on information stored with BMC 121, for example an internal variable or a log entry indicating that BMC 121 instructed battery module 122 to perform a learn cycle. BMC 121 may provide the indication based on accessing status information within battery module 122, for example by reading status information from battery module 122 over an I2C bus. In an embodiment, BMC 121 may provide the indication by storing a value into a memory accessible to both BMC 111 and BMC 121. In an embodiment, BMC 121 may provide the indication to BMC 111 on communication link 130. The indication may be provided by BMC 121 in response to receiving a request on communication link 130 from BMC 111 for status information about battery module 121. In an embodiment, the indication may be sent by BMC 121 to BMC 111 on communication link 130 in response to a learn cycle beginning in battery module 122.

BMC 111 is further operable to postpone the learn cycle on battery module 112, for which a need has been determined, in response to receiving the indication that a learn cycle is in progress on battery module 122. In particular embodiments the length of the postponement interval may be a predetermined length of time or a user supplied length of time. In an embodiment, the postponement interval ends in response to a user command. After the postponement interval ends, BMC 111 may repeat determining the need to initiate a learn cycle. In response to determining a need to initiate a learn cycle on battery module 112 and to detecting that a learn cycle is no longer in progress on battery module 122, BMC 111 initiates the learn cycle on battery module 122. In an embodiment, an indication sent by BMC 121 and received by BMC 111 indicating that the learn cycle on battery module 122 is complete may terminate the postponement, and BMC 111 may initiate a learn cycle on battery module 112 without again determining a need to initiate the learn cycle.

In an embodiment, BMC 111 is further configured to provide an indication to BMC 121 indicating that a learn cycle on battery module 112 is complete. The indication may be provided in response to the learn cycle completing successfully. The indication may be provided by storing a value into a memory accessible to both BMC 111 and BMC 121. In an embodiment, BMC 111 may provide the indication to BMC 121 on communication link 130. The indication may be provided by BMC 111 in response to receiving a request on communication link 130 from BMC 121 for status information.

The previous discussion applies when the roles of BMC 111 and BMC 121 are reversed, with BMC 121 operable to determine a need to initiate a learn cycle on battery module 122, detect that a learn cycle is in progress on Battery Module 112, and postpone the learn cycle on battery module 122. In an embodiment, the relationships between processor module 110 and processor module 120, and their associated BMC's and battery modules may be symmetric. In an embodiment, processor module 110 may be designated as a master processor module and processor module 120 may be designated as a slave processor module. The master processor module may be operable to initiate all transactions on, or otherwise control access to, communication link 130. The master and slave processor modules may be configured to use different intervals between learn cycles, or to use different time intervals to postpone a learn cycle. For purposes of illustration, two processor modules are shown in FIG. 1. Those skilled in the art will appreciate that more than two processor modules may be used with the present disclosure. For example, three processor modules may be configured as one master processor module and two slave processor modules.

Figure 2:
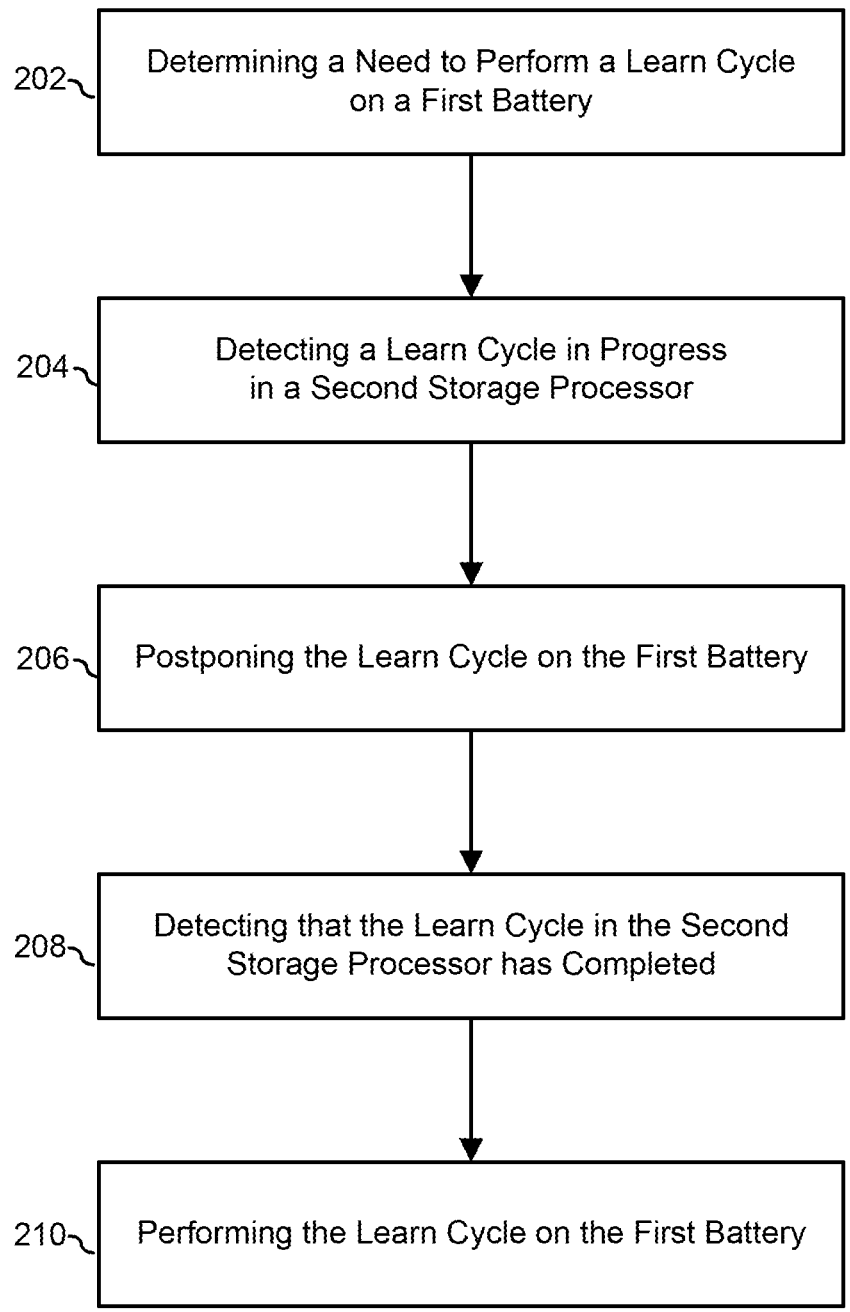
FIG. 2 is a flow diagram of a battery management method according to an embodiment of the present disclosure.

FIG. 2 shows a method 200 where in step 202, a need to initiate a learn cycle on a first battery in a first battery module is determined. A need to initiate a learn cycle may be determined in various ways depending on the embodiment. In an embodiment, a learn cycle may need to be initiated if a predetermined period of time, for example 180 days, has elapsed since the most recent learn cycle completed on the battery. A baseboard management controller may determine the time elapsed by storing the completion date and time of a successfully completed learn cycle, and periodically comparing the current date and time with the stored date and time. In response to the difference between the current date and time and the stored date and time being greater than the predetermined value, the baseboard management controller will determine a need to initiate a learn cycle. In another embodiment, a baseboard management controller may add the predetermined time interval to the completion date and time of a learn cycle to compute the date and time of a next scheduled learn cycle and store the computed date and time. The baseboard management controller may periodically compare the current date and time to the stored date and time. When the current date and time is later than the stored date and time, the baseboard management controller will determine a need to initiate a learn cycle.

In an embodiment, a baseboard management controller may determine a need to initiate a learn cycle based on detecting that the battery module of a processor module has been changed. A battery module installed in a processor module may provide its serial number, or other identifying information, at the request of the processor module's baseboard management controller. The baseboard management controller may compare the serial number retrieved from the battery module with a serial number previously retrieved and stored by the baseboard management controller. When the serial numbers are different, the baseboard management controller may determine that the installed battery module is new and select a learn time for the battery module. The baseboard management controller may store the selected date and time and periodically compare the selected date and time with the current date and time. When the current date and time is later than the selected date and time, the baseboard management controller may determine a need to initiate a learn cycle on the battery module.

In an embodiment, a baseboard management controller determines a need to initiate a learn cycle on a battery in a battery module based on receiving a command from a system management controller.

Step 202 may also be performed, in an embodiment, by a CPU of a processor module. A CPU may be coupled to interface circuitry allowing the CPU to communicate with a battery module in the processor module. The CPU may perform any or all of the actions of step 202 as described for a baseboard management controller.

The method illustrated in flow diagram 200 continues with step 204, detecting that a learn cycle is in progress in a second storage processor. This step may be performed by a baseboard management controller in a first storage processor in communication with a second baseboard management controller in a second storage processor. In an embodiment, the second baseboard management controller communicates with a battery module in the second storage processor, detects that a learn cycle is in progress, and reports that the learn cycle is in progress in response to an inquiry message from the first baseboard management controller. The inquiry and response messages may be sent on a communication network. In an embodiment, the communication network may allow baseboard management controllers to communicate directly. In an embodiment, the communication network may allow communication through other devices, for example through a system management controller or chassis management controller. In other embodiments, the second baseboard management controller stores status information about a learn cycle on a battery in the second storage processor in a memory accessible to both the first baseboard management controller and the second baseboard management controller.

In an embodiment, step 204 is performed by a CPU on a storage processor. The CPU is coupled to interface circuitry allowing the CPU to communicate with battery modules and network interfaces. The CPU performs the functions illustrated above as performed by a baseboard management controller. The CPU in the storage processor sends a message through a network interface to a second CPU in a second storage processor, requesting the status of a battery learn cycle in the second storage processor. The second CPU replies with status information about a learn cycle, allowing the CPU in the storage processor to determine that a learn cycle is in progress in the second storage processor.

The method illustrated in flow diagram 200 continues with step 206, postponing the learn cycle on the first battery. In response to detecting a learn cycle in progress in a second storage processor, a baseboard management controller may elect to initiate the learn cycle on the battery at a later time. In an alternative embodiment to that shown in FIG. 2, the method postpones the learn cycle by a predetermined time interval and proceed directly to step 210. For example, a time interval greater than the duration of a battery learn cycle may be predetermined and added to the current date and time to determine a revised date and time at which to initiate the learn cycle on the first battery. The revised date and time is periodically compared with the current date and time, and when the current date and time is later than the revised date and time the learn cycle is initiated on the first battery.

Returning to the method of flow diagram 200, in step 208 the learn cycle in the second storage processor, detected as being in progress in step 204, is detected as completed. Detecting completion of the learn cycle in the second storage processor may be accomplished by any means used to detect that the learn cycle was in progress is step 204. These means include baseboard management controllers or CPU's communicating by sending and receiving messages on a communication network, exchanging status information on a communication link or setting values in a memory accessible to both storage processors. The means used to detect completion of the learn cycle may be different than the means used to detect the learn cycle in progress.

In step 210 the learn cycle on the first battery is initiated. The baseboard management controller sends a command to the first battery module to perform a learn cycle on the first battery. In an embodiment, step 210 may be preceded by a second determination of a need to initiate a learn cycle on the first battery. During the postponement of step 206, changes may have occurred that remove the need for the learn cycle. For example, the first battery may have been replaced during the postponement interval and the new battery may not require an immediate learn cycle.

In an embodiment, steps 206, 208 and 210 are performed by a CPU on a storage processor, the CPU being coupled to appropriate interface circuitry to communicate with battery modules and network interfaces.

In an embodiment, step 210 is followed by an additional step indicating to other storage processor modules that the learn cycle has completed.

Figure 3:
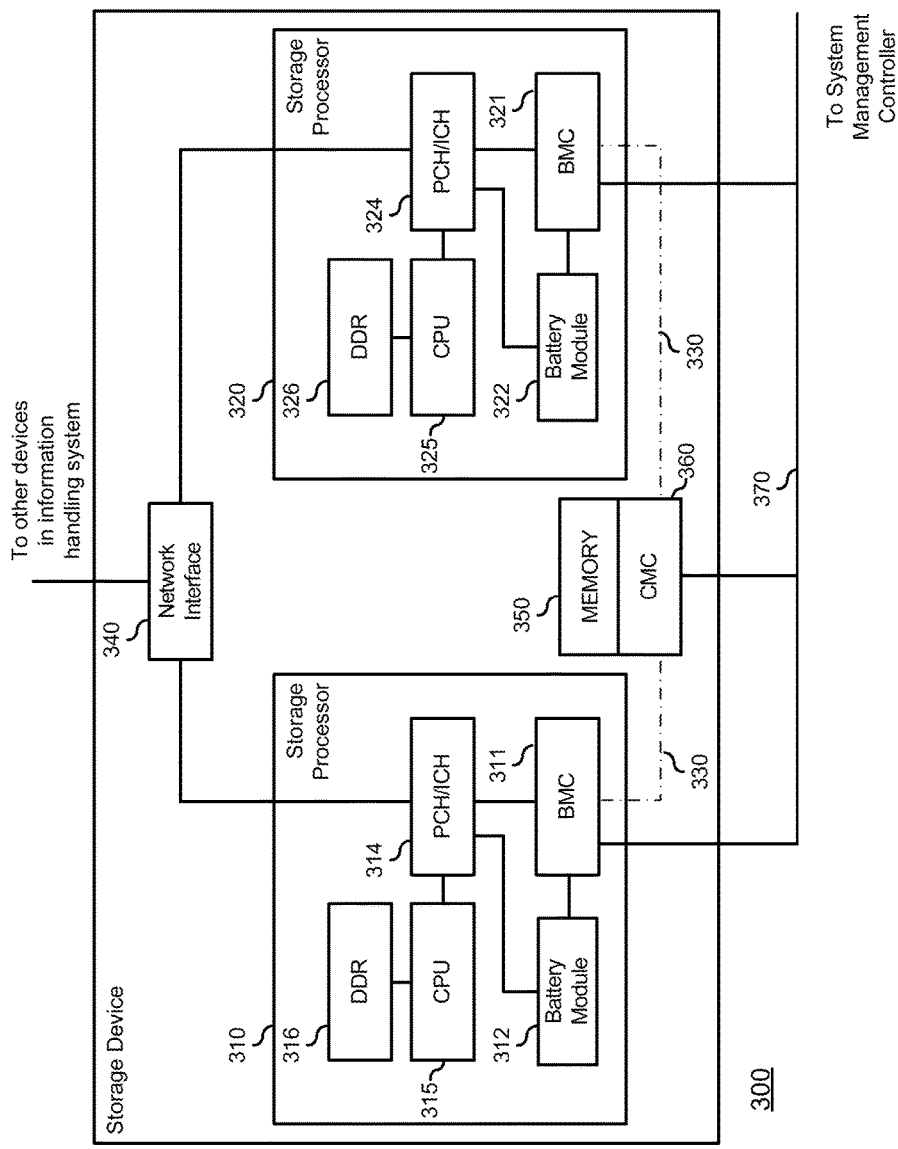
FIG. 3 is a block diagram of storage device according to an embodiment of the present disclosure.

FIG. 3 shows storage device 300 including storage processors 310 and 320. Storage processor 310 is configured with BMC 311, battery module 312, PCH/ICH 314, CPU 315 and DDR 316. BMC 311 is a baseboard management controller coupled to battery module 312 and PCH/ICH 314. PCH/ICH 314 is a platform controller hub, I/O controller hub or chipset, coupling CPU 315 to network interface 340, battery module 312 and BMC 311. DDR 316 is a memory module coupled to CPU 315, configured to store program instructions and data for CPU 315. Storage processor 320 is similarly configured with BMC 321, battery module 322, PCH/ICH 324, CPU 325 and DDR 326. Network interface 340 is configured to provide a communication interface for storage processors 310 and 320. Storage processors 310 and 320 may communicate with each other or with other devices in an information handling system through network interface 340.

Storage device 300 is further configured with CMC 360, a chassis management controller. CMC 360 may perform management functions for a chassis containing storage processors 310 and 320. CMC 360 is coupled to and may communicate with BMC 311 and BMC 321 using communication network 330. CMC 360 may, in an embodiment, process messages sent between BMC 311 and BMC 321. Processing may include storing messages, forwarding messages, storing information contained in messages and providing stored information in response to messages. Information from messages may be stored in memory 350. In an embodiment, a message sent by BMC 311 or BMC 321 may include a command to write an indication into memory 350 or a command to read an indication from memory 350.

BMC 311, BMC 321 and CMC 360 may be coupled to network 370. Network 370 is coupled to a system management controller external to storage device 300. The system management controller sends messages to and receive messages from BMC 311, BMC 321 and CMC 360 using network 370. The messages may contain commands, responses to commands, and status information.

Storage processor 310 is operable to determine a need for a battery learn cycle on a battery in battery module 312. In various embodiments, the determination may be based on the elapsed time since a previous learn cycle on battery module 312, the time elapsed since battery module 312 was installed, or a command from a system controller.

Storage processor 310 is further operable to receive an indication that a learn cycle is in progress on battery module 322 in storage processor 320. In an embodiment, storage processor 310 may receive the indication through network interface 340. In an embodiment, storage processor 310 may receive the indication from a system management controller. In an embodiment, storage processor 310 may receive the indication through communication network 330. The indication received through communication network 330 may be transmitted by a module coupled to communication network 330, for example by storage processor 320 or by CMC 360. The indication may be received in response to an inquiry message or memory read message sent on communication network 330 by storage processor 310.

Storage processor 310 is further operable to delay the battery learn cycle on battery module 312 in response to receiving an indication that a learn cycle is in progress on battery module 322. In an embodiment, the battery learn cycle on battery module 312 may be delayed until the battery learn cycle on battery module 322 is complete. Storage processor 310 may determine that the battery learn cycle on battery module 322 is complete by receiving a message through network interface 340, through communication network 330, or through network 370.

In an embodiment, BMC 311 may be operable to perform actions including determining a need to perform a learn cycle, receiving an indication that a second learn cycle is in progress, and delaying the learn cycle. BMC 311 may receive the indication that a second learn cycle is in progress from CMC 360. CMC 360 may receive the indication from BMC 321 on storage controller 320.

In an embodiment, a program stored in DDR 316 executing on CPU 315 may be operable to perform actions including determining a need to perform a learn cycle, receiving an indication that a second learn cycle is in progress, and delaying the learn cycle. CPU 315 may receive the indication that a second learn cycle is in progress from storage processor 320 through PCH/ICH 314. PCH/ICH 314 may receive the indication from storage processor 320 through network interface 340, or from network 330 through BMC 311.

In an embodiment, the indication that a second learn cycle is in progress on battery module 322 may be provided by CPU 325 executing a program stored in DDR 326. FIG. 3 illustrates an embodiment in which CPU 325 communicates with battery module 322 through PCH/ICH 324 and BMC 321. In other embodiments CPU 325 may be coupled to battery module 322 directly or through other modules (not shown). CPU 325 may provide the indication to storage module 310 through network interface 340, through communication network 330, or through another communication channel provided by storage device 300.

Figure 4:
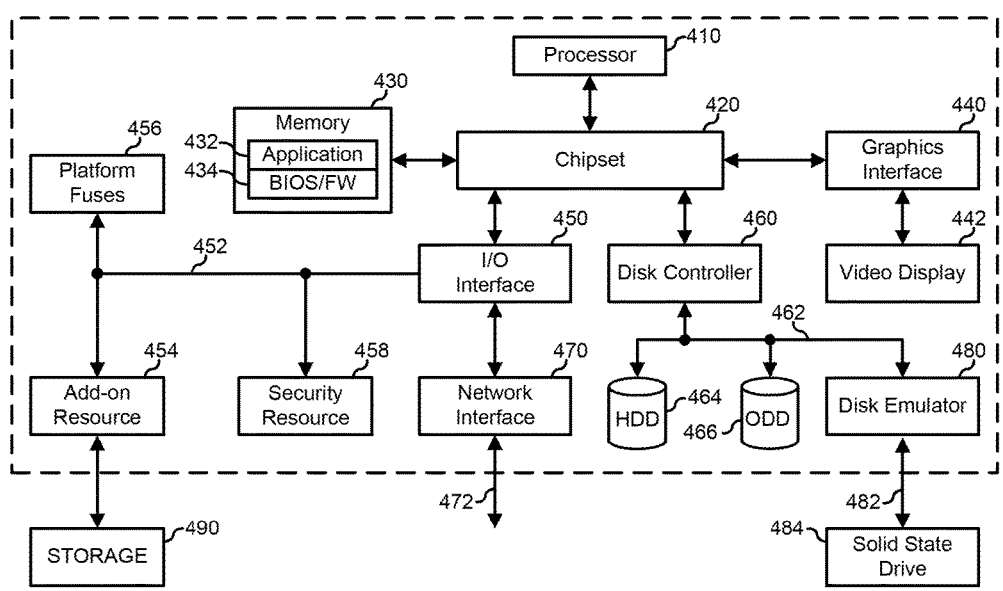
FIG. 4 is a block diagram illustrating an information handling system according to an embodiment of the present disclosure.

FIG. 4 is a block diagram illustrating an embodiment of an information handling system 400, including a processor 410, a chipset 420, a memory 430, a graphics interface 440, an input/output (I/O) interface 450, a disk controller 460, a network interface 470, and a disk emulator 480. In a particular embodiment, information handling system 400 is used to carry out one or more of the methods described herein. In another embodiment, one or more of the systems described herein are implemented in the form of information handling system 400.

Chipset 420 is connected to and supports processor 410, allowing the processor to execute machine-executable code. In a particular embodiment, information handling system 400 includes one or more additional processors, and chipset 420 supports the multiple processors, allowing for simultaneous processing by each of the processors and permitting the exchange of information among the processors and the other elements of the information handling system. Chipset 420 can be connected to processor 410 via a unique channel, or via a bus that shares information among the processor, the chipset, and other elements of information handling system 400.

Memory 430 is connected to chipset 420. Memory 430 and chipset 420 can be connected via a unique channel, or via a bus that shares information among the chipset, the memory, and other elements of information handling system 400. In another embodiment (not illustrated), processor 410 is connected to memory 430 via a unique channel. In another embodiment (not illustrated), information handling system 400 includes separate memory dedicated to each of the one or more additional processors. A non-limiting example of memory 430 includes static random access memory (SRAM), dynamic random access memory (DRAM), non-volatile random access memory (NVRAM), read only memory (ROM), flash memory, another type of memory, or any combination thereof.

Graphics interface 440 is connected to chipset 420. Graphics interface 440 and chipset 420 can be connected via a unique channel, or via a bus that shares information among the chipset, the graphics interface, and other elements of information handling system 400. Graphics interface 440 is connected to a video display 442. Other graphics interfaces (not illustrated) can also be used in addition to graphics interface 440 as needed or desired. Video display 442 includes one or more types of video displays, such as a flat panel display, another type of display device, or any combination thereof.

I/O interface 450 is connected to chipset 420. I/O interface 450 and chipset 420 can be connected via a unique channel, or via a bus that shares information among the chipset, the I/O interface, and other elements of information handling system 400. Other I/O interfaces (not illustrated) can also be used in addition to I/O interface 450 as needed or desired. I/O interface 450 is connected via an I/O interface 452 to one or more add-on resources 454. Add-on resource 454 is connected to a storage system 490, and can also include another data storage system, a graphics interface, a network interface card (NIC), a sound/video processing card, another suitable add-on resource or any combination thereof. I/O interface 450 is also connected via I/O interface 452 to one or more platform fuses 456 and to a security resource 458. Platform fuses 456 function to set or modify the functionality of information handling system 400 in hardware. Security resource 458 provides a secure cryptographic functionality and includes secure storage of cryptographic keys. A non-limiting example of security resource 458 includes a Unified Security Hub (USH), a Trusted Platform Module (TPM), a General Purpose Encryption (GPE) engine, another security resource, or a combination thereof.

Disk controller 460 is connected to chipset 420. Disk controller 460 and chipset 420 can be connected via a unique channel, or via a bus that shares information among the chipset, the disk controller, and other elements of information handling system 400. Other disk controllers (not illustrated) can also be used in addition to disk controller 460 as needed or desired. Disk controller 460 includes a disk interface 462. Disk controller 460 is connected to one or more disk drives via disk interface 462. Such disk drives include a hard disk drive (HDD) 464, and an optical disk drive (ODD) 466, and can include one or more disk drive as needed or desired. ODD 466 can include a Read/Write Compact Disk (R/W-CD), a Read/Write Digital Video Disk (R/W-DVD), a Read/Write mini Digital Video Disk (R/W mini-DVD, another type of optical disk drive, or any combination thereof. Additionally, disk controller 460 is connected to disk emulator 480. Disk emulator 480 permits a solid-state drive 484 to be coupled to information handling system 400 via an external interface 482. External interface 482 can include industry standard busses such as USB or IEEE 1394 (Firewire) or proprietary busses, or any combination thereof. Alternatively, solid-state drive 484 can be disposed within information handling system 400.

Network interface device 470 is connected to I/O interface 450. Network interface 470 and I/O interface 450 can be coupled via a unique channel, or via a bus that shares information among the I/O interface, the network interface, and other elements of information handling system 400. Other network interfaces (not illustrated) can also be used in addition to network interface 470 as needed or desired.

Network interface 470 can be a network interface card (NIC) disposed within information handling system 400, on a main circuit board such as a baseboard, a motherboard, or any combination thereof, integrated onto another component such as chipset 420, in another suitable location, or any combination thereof. Network interface 470 includes a network channel 472 that provide interfaces between information handling system 400 and other devices (not illustrated) that are external to information handling system 400. Network interface 470 can also include additional network channels (not illustrated).

Information handling system 400 includes one or more application programs 432, and Basic Input/Output System and Firmware (BIOS/FW) code 434. BIOS/FW code 434 functions to initialize information handling system 400 on power up, to launch an operating system, and to manage input and output interactions between the operating system and the other elements of information handling system 400. In a particular embodiment, application programs 432 and BIOS/FW code 434 reside in memory 430, and include machine-executable code that is executed by processor 410 to perform various functions of information handling system 400. In another embodiment (not illustrated), application programs and BIOS/FW code reside in another storage medium of information handling system 400. For example, application programs and BIOS/FW code can reside in HDD 464, in a ROM (not illustrated) associated with information handling system 400, in an option-ROM (not illustrated) associated with various devices of information handling system 400, in storage system 490, in a storage system (not illustrated) associated with network channel 472, in another storage medium of information handling system 400, or a combination thereof. Application programs 432 and BIOS/FW code 434 can each be implemented as single programs, or as separate programs carrying out the various features as described herein.

In the embodiments described herein, an information handling system includes any instrumentality or aggregate of instrumentalities operable to compute, classify, process, transmit, receive, retrieve, originate, switch, store, display, manifest, detect, record, reproduce, handle, or use any form of information, intelligence, or data for business, scientific, control, entertainment, or other purposes. For example, an information handling system can be a personal computer, a consumer electronic device, a network server or storage device, a switch router, wireless router, or other network communication device, a network connected device (cellular telephone, tablet device, etc.), or any other suitable device, and can vary in size, shape, performance, price, and functionality. The information handling system can include memory (volatile (e.g. random-access memory, etc.), non-volatile (read-only memory, flash memory etc.) or any combination thereof), one or more processing resources, such as a central processing unit (CPU), a graphics processing unit (GPU), hardware or software control logic, or any combination thereof. Additional components of the information handling system can include one or more storage devices, one or more communications ports for communicating with external devices, as well as, various input and output (I/O) devices, such as a keyboard, a mouse, a video/graphic display, or any combination thereof. The information handling system can also include one or more buses operable to transmit communications between the various hardware components. Portions of an information handling system may themselves be considered information handling systems.

When referred to as a "device," a "module," or the like, the embodiments described herein can be configured as hardware. For example, a portion of an information handling system device may be hardware such as, for example, an integrated circuit (such as an Application Specific Integrated Circuit (ASIC), a Field Programmable Gate Array (FPGA), a structured ASIC, or a device embedded on a larger chip), a card (such as a Peripheral Component Interface (PCI) card, a PCI-express card, a Personal Computer Memory Card International Association (PCMCIA) card, or other such expansion card), or a system (such as a motherboard, a system-on-a-chip (SoC), or a stand-alone device). The device or module can include software, including firmware embedded at a device, such as a Pentium class or PowerPC™ brand processor, or other such device, or software capable of operating a relevant environment of the information handling system. The device or module can also include a combination of the foregoing examples of hardware or software. Note that an information handling system can include an integrated circuit or a board-level product having portions thereof that can also be any combination of hardware and software.

Devices, modules, resources, or programs that are in communication with one another need not be in continuous communication with each other, unless expressly specified otherwise. In addition, devices, modules, resources, or programs that are in communication with one another can communicate directly or indirectly through one or more intermediaries.

Although only a few exemplary embodiments have been described in detail herein, those skilled in the art will readily appreciate that many modifications are possible in the exemplary embodiments without materially departing from the novel teachings and advantages of the embodiments of the present disclosure. Accordingly, all such modifications are intended to be included within the scope of the embodiments of the present disclosure as defined in the following claims. In the claims, means-plus-function clauses are intended to cover the structures described herein as performing the recited function and not only structural equivalents, but also equivalent structures.

What is claimed is:

1. A method comprising:
   determining, by a first baseboard management controller of a first processing module, a need for initiating a first learn cycle on a first battery of the first processing module, wherein the first battery, the first baseboard management controller and the first processing module are located within an information handling system;
   detecting, by the first baseboard management controller, that a second learn cycle is in progress on a second battery of a second processing module, wherein detecting that the second learn cycle is in progress includes detecting, by the first baseboard management controller, an indication that the second learn cycle is in progress, wherein the second battery and the second processing module are located within the information handling system; and
   postponing the first learn cycle, in response to detecting that the second learn cycle is in progress.

2. The method of claim 1, further comprising:
   detecting, by the first baseboard management controller, that the second learn cycle has completed; and
   initiating the first learn cycle, in response to detecting that the second learn cycle has completed.

3. The method of claim 2, further comprising:
providing an indication that the first learn cycle is complete, in response to successful performance of the first learn cycle.

4. The method of claim 1, further comprising:
generating, by a second baseboard management controller, the indication that the second learn cycle is in progress; and
providing, by the second baseboard management controller, the indication that the second learn cycle is in progress.

5. The method of claim 4, wherein providing the indication further comprises:
sending status information on a communication network accessible to the first baseboard management controller and to the second baseboard management controller.

6. The method of claim 5, wherein the communication network is an inter-baseboard management controller communication link.

7. The method of claim 4, wherein determining the need for initiating the first learn cycle comprises:
receiving a command to perform the first learn cycle from a system management controller.

8. The method of claim 4, wherein determining the need for initiating the first learn cycle comprises:
retrieving a predetermined learn time of the first learn cycle;
comparing the predetermined learn time with a current time; and
determining that the current time is later than the predetermined learn time of the first learn cycle.

9. A first processor module comprising:
a first battery; and
a first baseboard management controller, the first baseboard management controller configured to:
determine a need to initiate a first learn cycle on the first battery of the first processor module by receiving a command to perform the first learn cycle from a system management controller;
detect that a second learn cycle is in progress on a second battery of a second processor module;
postpone the first learn cycle, in response to detecting that the second learn cycle is in progress;
detect that the second learn cycle is complete; and
initiate the first learn cycle.

10. The first processor module of claim 9, wherein the first baseboard management controller detects that the second learn cycle is in progress by detecting an indication that the second learn cycle is in progress generated by a second baseboard management controller of the second processor module.

11. The first processor module of claim 10, wherein an inter-baseboard management controller communication link couples the first baseboard management controller and the second baseboard management controller, and first baseboard management controller receives the indication that the second learn cycle is in progress from the second baseboard management controller through the inter-baseboard management controller communication link.

12. The first processor module of claim 9, wherein the first baseboard management controller is coupled to a memory location accessible by a second baseboard management controller of the second processor module, and the first baseboard management controller detects that a second learn cycle is in progress by monitoring the memory location for a value written to the memory location by the second baseboard management controller.

13. The first processor module of claim 9, wherein:
in determining the need to initiate the first learn cycle, the first baseboard management controller is further configured to:
retrieve a predetermined learn time of the first learn cycle;
compare the predetermined learn time with a current time; and
determine that the current time is later than the predetermined learn time of the first learn cycle.

14. The first processor module of claim 9, wherein:
in determining the need to initiate the first learn cycle, the first baseboard management controller is further configured to:
retrieve a stored battery serial number;
retrieve a first battery serial number from the first battery;
compare the stored battery serial number to the first battery serial number;
select a learn time for the first battery, in response to the comparing;
compare the learn time with a current time; and
determine that the current time is later than the learn time.

15. The first processor module of claim 9, wherein the first baseboard management controller is further configured to:
provide an indication the first learn cycle is complete, in response to successful completion of the first learn cycle.

16. A power supply device comprising:
an internal communication network;
a first battery module;
a second battery module;
a first baseboard management controller coupled to the internal communication network and the first battery module, and configured to determine a need for performing a first battery learn cycle; and
a second baseboard management controller coupled to the internal communication network and the second battery module, the second baseboard management controller configured to generate an indication that a battery learn cycle is in progress, wherein the first baseboard management controller is configured to receive the indication that the second battery learn cycle is in progress, and in response, delay the first battery learn cycle.

17. The network storage device of claim 16, further comprising:
a first storage processor comprising the first baseboard management controller and the first battery module; and
a second storage processor comprising the second baseboard management controller and the second battery module.

18. The network storage device of claim 16, further comprising:
a chassis management controller coupled to the internal communication network, the chassis management controller operable to:
receive the indication from the second baseboard management controller; and
provide the indication to the first baseboard management controller.

19. The network storage device of claim 16, wherein the first battery module comprises first battery cells, first power regulation circuitry, first charging circuitry, and first control circuitry, and wherein the second battery module comprises second battery cells, second power regulation circuitry, second charging circuitry, and second control circuitry.

\* \* \* \* \*